US012642031B2

(12) United States Patent
Fukuoka

(10) Patent No.: US 12,642,031 B2
(45) Date of Patent: May 26, 2026

(54) SUBSTRATE CLEANING APPARATUS

(71) Applicant: SHIBAURA MECHATRONICS CORPORATION, Kanagawa (JP)

(72) Inventor: Yotaro Fukuoka, Kanagawa (JP)

(73) Assignee: Shibaura Mechatronics Corporation, Kanagawa (JP)

( * ) Notice: Subject to any disclaimer, the term of this patent is extended or adjusted under 35 U.S.C. 154(b) by 462 days.

(21) Appl. No.: 18/239,371

(22) Filed: Aug. 29, 2023

(65) Prior Publication Data

US 2024/0071744 A1 Feb. 29, 2024

(30) Foreign Application Priority Data

Aug. 30, 2022 (JP) ................................. 2022-137200
Jul. 18, 2023 (JP) ................................. 2023-116846

(51) Int. Cl.
*H10P 70/00* (2026.01)
*H10P 52/00* (2026.01)
*H10P 72/00* (2026.01)

(52) U.S. Cl.
CPC .............. *H10P 70/15* (2026.01); *H10P 52/00* (2026.01); *H10P 72/0414* (2026.01); *H10P 72/0604* (2026.01)

(58) Field of Classification Search
CPC ............. H01L 21/02052; H01L 21/304; H01L 21/67051; H01L 21/67253; H10P 52/00; H10P 70/15; H10P 72/0411; H10P 72/0414; H10P 72/0604
See application file for complete search history.

(56) References Cited

U.S. PATENT DOCUMENTS

2013/0182941 A1* 7/2013 Hikida .................... G06T 7/001
382/149
2015/0254827 A1 9/2015 Kobayashi

FOREIGN PATENT DOCUMENTS

CN 1691288 A 11/2005
JP 2002-217151 A 8/2002
JP 2003-077877 A 3/2003
KR 2015-0105217 A 9/2015

* cited by examiner

*Primary Examiner* — Benjamin Kendall
(74) *Attorney, Agent, or Firm* — Venjuris, P.C.

(57) ABSTRACT

According to one embodiment of the present disclosure, a substrate cleaning apparatus includes a hydrophilization chamber connected to a polishing apparatus and that accommodates a substrate having a polished surface polished by the polishing apparatus; a support provided in the hydrophilization chamber; a liquid supply unit that supplies a cleaning liquid to the polished surface of the substrate to hydrophilize the polished surface; an imaging unit that captures an image of the polished surface supplied with the cleaning liquid; a determination unit that determines whether hydrophilization is achieved on a basis of the image; an adjustment unit that adjusts the supply of the cleaning solution by the liquid supply unit depending on a determination result obtained by the determination unit; and a cleaning chamber connected to the hydrophilization chamber and that cleans the polished surface hydrophilized by the cleaning liquid.

8 Claims, 5 Drawing Sheets

SUBSTRATE CLEANING APPARATUS

CROSS-REFERENCE TO RELATED APPLICATIONS

This application is based on and claims priority from Japanese Patent Application Nos. 2022-137200 and 2023-116846, filed on Aug. 30, 2022 and Jul. 18, 2023, respectively, with the Japan Patent Office, the disclosures of which are incorporated herein in their entireties by reference.

TECHNICAL FIELD

The present disclosure relates to substrate cleaning apparatus.

BACKGROUND

The manufacturing process of semiconductor devices may involve cleaning the surface of a semiconductor wafer serving as a substrate with a high degree of cleanliness. In one example, chemical mechanical polishing (CMP) is used to planarize the substrate surface. However, CMP will result in the adhesion of particles (hereinafter referred to as contaminants) to the substrate surface. These contaminants include organic matter, metal-containing grinding chips, and slurry residue.

Such contaminants may cause interference with the formation of flat films, and potentially lead to short circuits in circuit patterns. As a result, such residues may contribute to the occurrence of defects in the semiconductor devices. Thus, such contaminants need to be removed by cleaning the substrate with a cleaning liquid. The cleaning apparatus that employs a rotating brush to perform such cleaning is known (see, e.g., Japanese Patent Laid-Open Publication No. 2003-077877).

The cleaning apparatus includes a brush-cleaning device and spin-cleaning device. The brush-cleaning device cleans a substrate using a rotating brush and cleaning liquid. That is, while the surface of the substrate that is rotating is supplied with the cleaning liquid, the rotating brush is contacted with the substrate and moved in a direction parallel to the substrate. As a result, the contaminants adhering to the surface of the substrate are floated, and the floated contaminants are discharged outside the substrate by the brush, thereby cleaning the entire substrate. The spin-cleaning device supplies the cleaning liquid to the rotating substrate and sprays a gas to the substrate thereby drying the substrate.

SUMMARY

When the substrate is dried after polishing, the polishing agent is fixed to the substrate, and thus it becomes difficult to remove the polishing agent from the substrate. Thus, in the substrate cleaning apparatus described above, ozone water or the like is ejected for a fixed time in a receiving chamber connected to a polishing apparatus to hydrophilize the substrate. Subsequently, the substrate is transferred to the brush-cleaning device for cleaning with the brush.

However, since the polished surface of the substrate is water-repellent, the hydrophilization may not be sufficient in some cases. As a result, when the hydrophilization of the substrate is insufficient after polishing, polishing agents may be dried during transferring of the substrate from the polishing apparatus to the brush-cleaning device and may be fixed to the substrate, thereby making it difficult to remove the fixed polishing agents from the substrate in the brush-cleaning apparatus.

Embodiments of the present disclosure provide a substrate cleaning apparatus capable of preventing a substrate after being subjected to polishing from being cleaned by a cleaning unit in an insufficient hydrophilic state.

The substrate cleaning apparatus provided in the present disclosure includes a chamber, a support unit, a supply unit, an imaging unit, a determination unit, an adjustment unit, and a cleaning unit. The chamber is loaded with a substrate having a polished surface polished by a polishing apparatus. The support unit is provided in the chamber to support the substrate. The supply unit supplies a cleaning liquid to the polished surface of the substrate supported by the support to hydrophilize the polished surface. The imaging unit captures an image of the polished surface supplied with the cleaning liquid from a lateral side of the substrate. The determination unit determines whether hydrophilization is achieved based on the image captured by the imaging unit. The adjustment unit adjusts the supply of the cleaning liquid by the supply unit according to a determination result obtained by the determination unit. The cleaning unit is connected to the chamber to clean the polished surface hydrophilized by the cleaning liquid.

The substrate cleaning apparatus of the present disclosure is capable of preventing a substrate subjected to polishing from being cleaned by the cleaning unit in an insufficient hydrophilic state.

The foregoing summary is illustrative only and is not intended to be in any way limiting. In addition to the illustrative aspects, embodiments, and features described above, further aspects, embodiments, and features will become apparent by reference to the drawings and the following detailed description.

DESCRIPTION OF EMBODIMENTS

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

<Overview>

Figure 1:
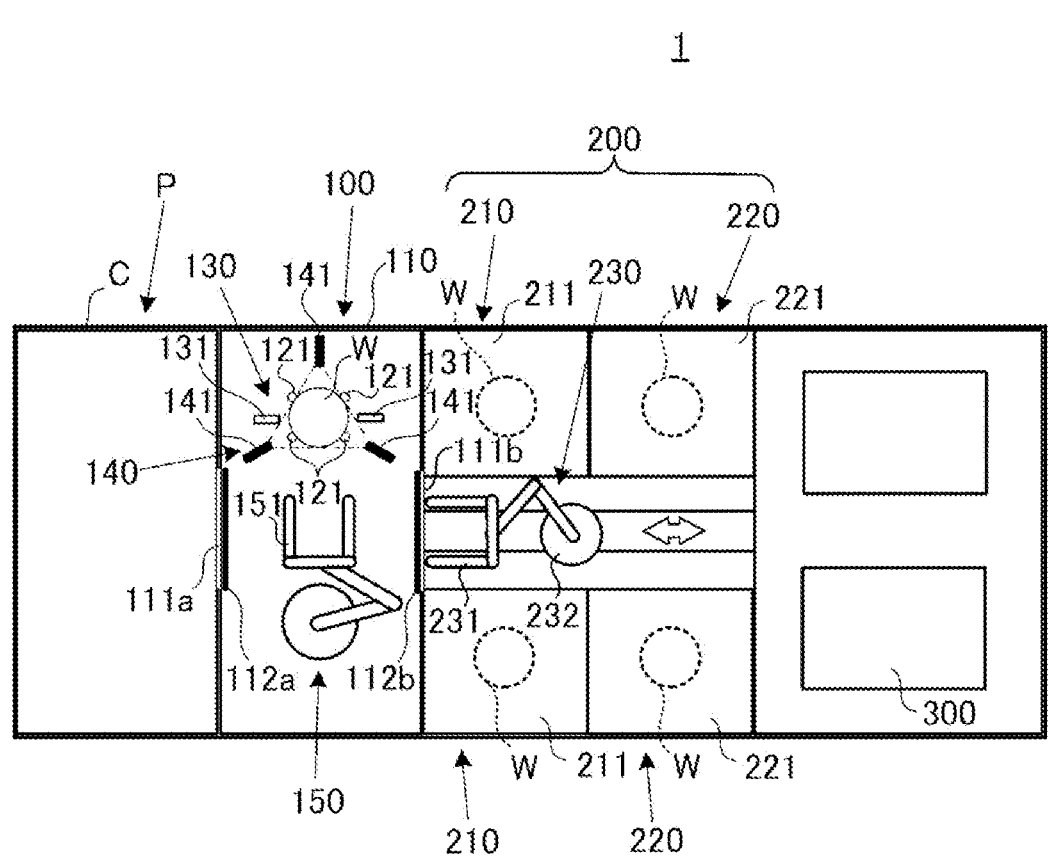
FIG. 1 illustrates a simplified plan view of a schematic configuration of substrate cleaning apparatus and a polishing apparatus according to an embodiment.

Embodiments of the present disclosure are now described with reference to the drawings. The present embodiment provides a substrate cleaning apparatus 1 that cleans a substrate W subjected to polishing in a polishing apparatus P, as illustrated in FIG. 1. The substrate cleaning apparatus 1 has a hydrophilization unit 100, a cleaning unit 200, and a control unit 300. The hydrophilization unit 100 supplies a cleaning liquid L to the polished surface of the substrate W subjected to polishing thereby hydrophilizing the substrate W. The cleaning unit 200 performs a brush cleaning and a spin cleaning on the polished surface of the hydrophilized substrate W. The control unit 300 controls the operations of the hydrophilization unit 100 and the cleaning unit 200.

Figure 2:
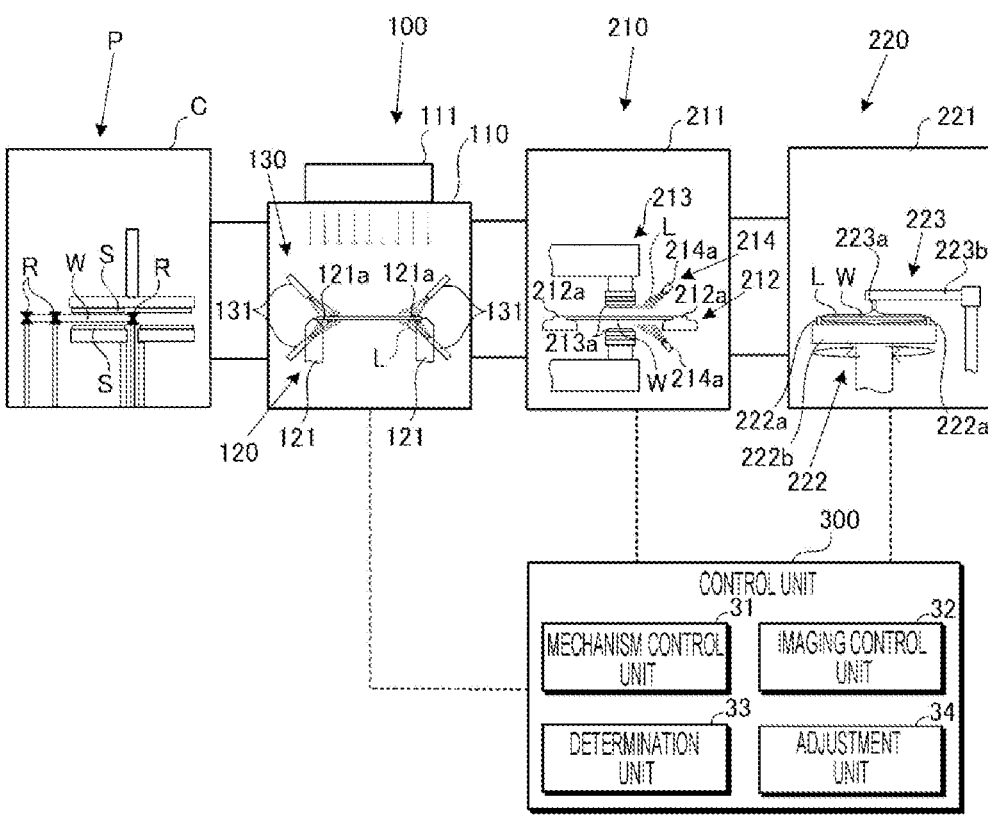
FIG. 2 illustrates a side view of the schematic configuration of the substrate cleaning apparatus and the polishing apparatus according to the present embodiment.

The polishing apparatus P polishes the front and back surfaces of the substrate W. The polishing apparatus P according to the present embodiment performs chemical mechanical polishing (CMP). The schematic configuration of the polishing apparatus P is illustrated in FIG. 2. In the polishing apparatus P, rotating rollers R grip the outer periphery of the substrate W and rotate the substrate W in a chamber C. Then, polishing is performed by bringing a polishing pad S that is rotating into contact with the front and back surfaces of the substrate W while supplying a cleaning liquid L to the surfaces, which will be described later.

The substrate W to be polished and cleaned is typically a circular semiconductor wafer. However, the substrate W may be a substrate for a display device. The surface of the substrate W that is polished by the polishing apparatus P is referred to as a "polished surface." In the present embodiment, the polished surface is the front and back surfaces of the substrate W. In the following description, the front and back polished surfaces are sometimes simply referred to as "both surfaces."

<Configuration>
(Hydrophilization Unit)

The hydrophilization unit 100 includes a chamber 110, a support unit 120, a supply unit 130, an imaging unit 140, and a transfer unit 150. The chamber 110 serves as a container in which the substrate W having a polished surface that is polished by the polishing apparatus P is loaded. The chamber 110 is provided with openings 111a and 111b for loading or unloading the substrate W between the polishing apparatus P and the cleaning unit 200. The openings 111a and 111b are opened and closed by shutters 112a and 112b, respectively. Upon loading or unloading the substrate W, the shutters 112a and 112b open the openings 111a and 111b, respectively. During the hydrophilization, the shutters 112a and 112b close the openings 111a and 111b, respectively.

As illustrated in FIG. 2, a fan filter unit (FFU) 111 is provided on the upper part of the chamber 110. The FFU 111 serves as a blower with a fan and a HEPA filter (not illustrated), which blows purified air into the chamber 110. The FFU 111 generates a downward flow from the ceiling of the chamber 110 toward the floor. This downward prevents dust from flying up and adhering to the substrate W. An exhaust port (not illustrated) is provided on the floor of the chamber 110.

As illustrated in FIG. 2, the support unit 120 is provided inside the chamber 110 to support the substrate W loaded into the chamber 110. The support unit 120 supports the substrate W to maintain a horizontal state so that both surfaces of the substrate W are exposed. The support unit 120 according to the present embodiment has four support pins 121 each having a vertical columnar shape. The respective support pins 121 are erected inside the chamber 110 along the periphery of the substrate W at regular intervals. Each of the support pins 121 has an inclined tapered surface 121a formed on the upper end. The tapered surface 121a of each of the support pins 121 is directed toward the center of the substrate W, and the outer peripheral edge of the substrate W is placed thereon. Therefore, the substrate W is supported in a stationary state without rotation.

Figure 3A:
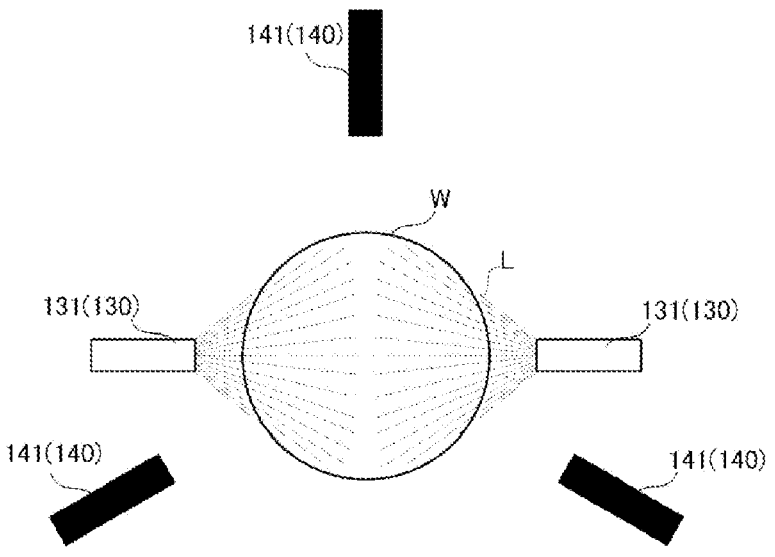
FIG. 3A is a plan view illustrating a state where a nozzle of a supply unit ejects a cleaning liquid onto a substrate.

As illustrated in FIG. 3A, the supply unit 130 supplies a cleaning liquid L to the polished surface of the substrate W supported by the support unit 120 to hydrophilize the polished surface of the substrate W. The supply unit 130 has multiple nozzles 131, which eject the cleaning liquid L onto the polished surface of the substrate W from the tips of the nozzles 131. The cleaning liquid L according to the present embodiment is ozone water or pure water. However, the cleaning liquid L may also be an SC-1 (mixture of ammonia hydroxide and hydrogen peroxide water).

The nozzles 131 are provided in pairs, with the center of the substrate W interposed therebetween. Further, the nozzles 131 are provided at positions capable of supplying the cleaning liquid L to both opposing polished surfaces of the substrate W (i.e., both surfaces). That is, a pair of nozzles 131 are provided at the top and bottom, respectively, across the substrate W. Each nozzle 131 has one end serving as a ejection port for ejecting the cleaning liquid L onto the polished surface of the substrate W at an inclined angle. This ejection port sprays out the cleaning liquid L in a fan shape spreading in a plan view.

The nozzles 131, which are provided in pairs facing each other on the upper and lower polished surfaces of the substrate W, respectively, spray the cleaning liquid L from the outside of the substrate W toward the vicinity of the center of the polished surface. Thus, the cleaning liquid L spreads over both surfaces of the substrate W from one outer peripheral end to the other peripheral end. The cleaning liquid L flows from the outer peripheral edge closer to the nozzle 131 to a distant outer peripheral edge. Thus, spraying in a single direction is likely to bias the cleaning liquid L to the distant outer peripheral end. In contrast, simultaneous spraying from two opposing directions enables the cleaning liquid L to counterbalance any directional disparities, leading to uniform spreading across the entire surface.

The nozzle 131 has the other end connected to a supply device (not illustrated) that delivers the cleaning liquid L through a pipe. The supply device has a liquid delivery mechanism, a valve, or a similar component connected to the ozonated-water production device (ozonated-water storage tank).

Figure 3B:
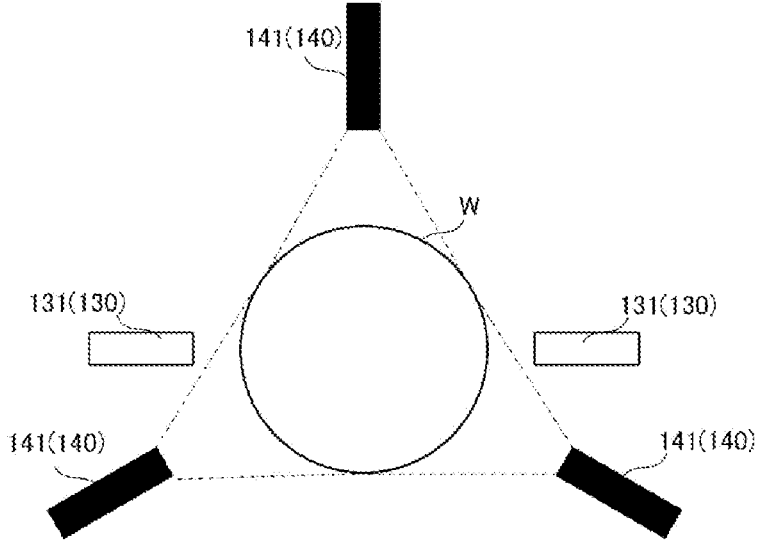
FIG. 3B is a plan view illustrating a state where an imaging unit captures an image of the substrate from its lateral side.
Figure 4A:
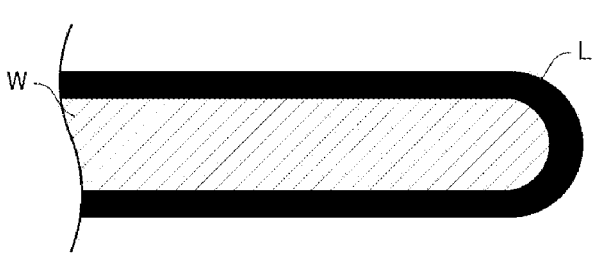
FIG. 4A illustrates a reference image in a hydrophilized state.
Figure 4B:
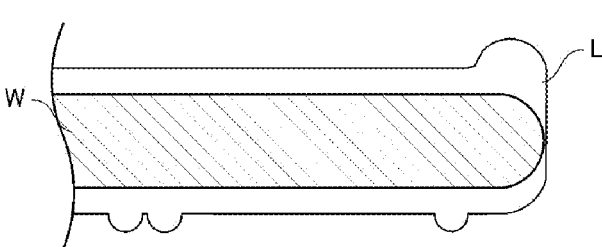
FIG. 4B illustrates an image of a sufficiently hydrophilized substrate.
Figure 4C:
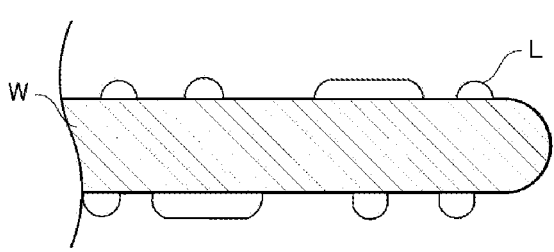
FIG. 4C illustrates an image of an insufficiently hydrophilized substrate.

The imaging unit 140 captures an image of the polished surface of the substrate W, which is supplied with the cleaning liquid L. The image is captured from the lateral side of the substrate W, as illustrated in FIG. 3B. This image-capturing from the lateral side refers to imaging so that the outer peripheral edge and the upper and lower liquid films are included in the field of view. FIGS. 4B and 4C illustrate examples of images captured in this way. The illustrations given in FIG. 4 are a part of the captured image of the substrate W, which encompasses even the opposite end of the substrate W. The imaging unit 140 has a plurality of cameras 141. The camera 141 is arranged adjacent to the substrate W so that the optical axis is oriented towards the outer peripheral edge of the substrate W. In the present embodiment, three cameras 141 are equidistantly arranged along the outer circumference of the substrate W. This configuration enables the imaging unit 140 to encompass the complete perimeter of the substrate W within its imaging range. That is, the camera 141 is arranged such that the optical axis is directed to the center of the substrate W supported horizontally on the support unit 120. In addition, the camera 141 is oriented parallel to the polished surface of the substrate W supported horizontally on the support unit 120 to ensure that the central position in the thickness direction of the substrate W aligns with its corresponding height.

The transfer unit 150 has a robotic hand 151. The robotic hand 151 grips the substrate W to transfer the substrate W loaded from the polishing apparatus P to the support unit 120.

(Cleaning Unit)

The cleaning unit 200 has a brush-cleaning device 210, a spin-cleaning device 220, and a transfer device 230, as illustrated in FIG. 1. The brush-cleaning device 210 and the spin-cleaning device 220 are provided in pairs, with the transfer device 230 interposed therebetween.

The brush-cleaning device 210 has a chamber 211, a rotation drive unit 212, a brush drive unit 213, and a liquid supply unit 214, as illustrated in FIG. 2. The chamber 211 serves as a container in which the substrate W is brush-cleaned. The rotation drive unit 212 rotates the substrate W while gripping the outer circumference of the substrate W with the plurality of rollers 212a.

The brush drive unit 213 brings a brush 213a, which is rotating, into contact with the polished surface of the substrate W. In addition, the brush drive unit 213 moves the brush 213a in a direction parallel to the polished surface of the substrate W. The brush 213a is provided in pairs on the top and bottom of the substrate W, so that the substrate W is sandwiched between the top and bottom. The liquid supply unit 214 supplies the cleaning liquid L to the upper and lower polished surfaces of the substrate W. The liquid supply unit 214 has a nozzle 214a that ejects the cleaning liquid L onto the polished surface of the substrate W.

The brush-cleaning device 210 causes the roller 212a to hold the substrate W loaded by the transfer device 230, which will be described later. The brush 213a, which is rotating, is brought into contact with both surfaces of the substrate W while supplying the cleaning liquid L to both surfaces of the substrate W rotating by the rollers 212a. The movement of the brush 213a in a direction parallel to the polished surface of the substrate W enables both surfaces of the substrate W to be cleaned.

The spin-cleaning device 220 has a chamber 221, a rotation drive unit 222, and a liquid supply unit 223. The chamber 221 serves as a container where the substrate W is spin-cleaned. The rotation drive unit 222 rotates the substrate W while gripping the outer periphery of the substrate W by pins 222a that attach to and detach from the substrate W. The pin 222a is provided on a rotary table 222b that is rotated by a motor. The liquid supply unit 223 supplies the cleaning liquid L to the upper and lower polished surfaces of the substrate W.

The liquid supply unit 223 has a nozzle 223a that ejects the cleaning liquid L onto the polished surface of the substrate W. The nozzle 223a, which is provided at the tip of a swing arm 223b, ejects the cleaning liquid L from above the substrate W. The nozzle 223a, which is incorporated in the rotary table 222b, ejects the cleaning liquid L from below the substrate W, though this aspect is not illustrated.

The spin-cleaning device 220 uses the pin 222a to grip the substrate W loaded by the transfer device 230. The nozzle 223a ejects the cleaning liquid L to clean both surfaces of the substrate W, which rotates as the rotary table 222b rotates.

The transfer device 230 has a robotic hand 231 and a movement mechanism 232. The robotic hand 231 grasps the substrate W. The movement mechanism 232 moves the robotic hand 231. The transfer device 230 transfer the substrate W between the hydrophilization unit 100 and the brush-cleaning device 210 and between the brush-cleaning device 210 and the spin-cleaning device 220. This transfer is performed in a state where a liquid film of the cleaning liquid L is formed on the polished surface of the substrate W. This approach prevents the polished surface of the substrate W from drying and prevents contaminants from adhering to the polished surface during the transfer of the substrate W.

(Control Unit)

The control unit 300 functions as a computer that controls the components in the substrate cleaning apparatus 1. The control unit 300 has a processor, memory, and a drive circuit. The control unit 300 drives individual components using the drive circuit. This is achieved by the processor executing programs and operational parameters stored in the memory. In other words, the control unit 300 controls the operations of the supply unit 130, the imaging unit 140, and the transfer unit 150. In addition, the control unit 300 controls the operations of the brush-cleaning device 210, the spin-cleaning device 220, and the transfer device 230. The control unit 300 may have an input device used for information entry and a display device used for information presentation.

The control unit 300 according to the present embodiment has a mechanism control unit 31, an imaging control unit 32, a determination unit 33, and an adjustment unit 34, as illustrated in FIG. 2. The mechanism control unit 31 controls the operation of the mechanism for the respective components. More specifically, the mechanism control unit 31 controls the operation of the robotic hand 151, the ejection of the cleaning liquid L from the nozzle 131, and the image-capturing by the imaging unit 140.

The imaging control unit 32 controls the timing of image-capturing executed by the imaging unit 140, enabled through the mechanism control unit 31. In one example, the imaging control unit 32 causes the imaging unit 140 to perform image-capturing at a predetermined timing. During this image-capturing, the mechanism control unit 31 stops the ejection of the cleaning liquid L from the nozzle 131. In one example, the cleaning liquid L is introduced for a duration of approximately 30 to 40 seconds before the supply is stopped, and at this timing, the imaging unit 140 captures an image of the substrate W. Furthermore, when the hydrophilization is insufficient, the cleaning liquid L is supplied for approximately 30 to 40 seconds, followed by the cessation of supply, and the imaging unit 140 captures an image of the substrate W.

The determination unit 33 determines whether the hydrophilization is achieved based on the image captured by the imaging unit 140 and the image of the polished surface with hydrophilization. In one example, the image captured from the lateral side of the substrate W is in a state where liquid films are formed to cover both surfaces of the substrate W, as illustrated in FIG. 4A. Such an image captured in advance by the imaging unit 140 is stored as a reference image in the memory. In this event, the determination unit 33 extracts and holds the contours of the cleaning liquid L and the substrate W. The reference image is obtained by capturing the substrate W, which is subjected to hydrophilization in an ideal state (normal state) through cleaning. The state where the hydrophilization is normally achieved is referred to as, for example, a state where the entire polished surface of the substrate W is covered with the cleaning liquid L. Furthermore, the reference image may be obtained by actual image-capturing or may be generated based on a design value or theoretical value.

In practical processing, the image of the substrate W with both sides hydrophilized also results in a state where the entire substrate W is covered with the cleaning liquid L, as illustrated in FIG. 4B. Meanwhile, an image with insufficient hydrophilization is illustrated in FIG. 4C. In this case, a portion where the surface of the substrate W is exposed occurs. In other words, a region without the presence of cleaning liquid L occurs, leading to a state where a portion of the polished surface become exposed.

Figure 4D:
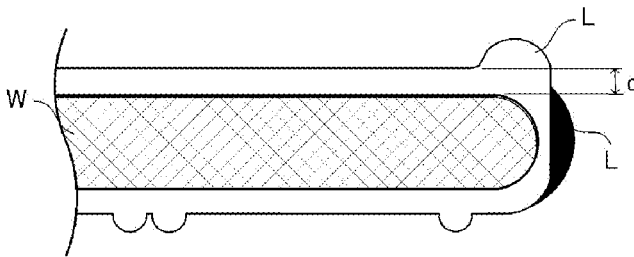
FIG. 4D illustrates an image superimposing images of FIGS. 4A and 4B.
Figure 4E:
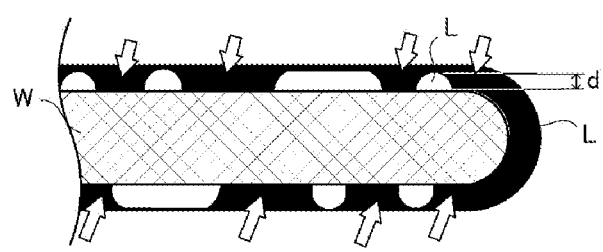
FIG. 4E illustrates an image superimposing images of FIGS. 4A and 4C.

Thus, the determination unit 33 determines whether the hydrophilization is achieved in the following manner. The determination unit 33 initially extracts the contours of the substrate W and the cleaning liquid L from the captured image. Then, the determination unit 33 superimposes the captured image and the reference image, as illustrated in FIGS. 4D and 4E. In this event, the determination unit 33 aligns the substrates W to ensure their outlines correspond. In the captured image, a portion where a distance d between the contour of the cleaning liquid L and the contour of the substrate W is equal to or less than a first threshold may be determined to be an insufficient hydrophilic portion. In one example, locations indicated by white arrows in FIG. 4E may be considered to have insufficient hydrophilization. The first threshold may be, for example, any value that is set within a range of 10% or less of the distance between the contour of the cleaning liquid L and the contour of the substrate W in the reference image. The determination unit 33 calculates the ratio of the area of the portion of the captured image with insufficient hydrophilization to the area of the cleaning liquid L in the reference image. When the ratio of the area of the portion with insufficient hydrophilization exceeds a second threshold, the determination unit 33 determines that the hydrophilization is incomplete. The second threshold may be, for example, any value that is set within a range of 10% or more of the area covered by the cleaning liquid L in the reference image. The first and second thresholds are entered in advance using the input device and stored in the memory.

In one example, there is a location where the distance d between the contour of the cleaning liquid L and the contour of the substrate W is smaller than the distance between the contour of the cleaning liquid L and the contour of the substrate W in the reference image (the black portion on the side surface of the substrate W in the figure), as illustrated in FIG. 4D. However, the distance d is not equal to or less than the first threshold, so there is no location with insufficient hydrophilization. Thus, the ratio of the area of the location where the hydrophilization is insufficient becomes the ratio of the area equal to or smaller than the second threshold, so it is determined that the hydrophilization is achieved.

In FIG. 4E, there is a location where the distance d between the contour of the cleaning liquid L and the contour of the substrate W is equal to or less than the first threshold (the location where the hydrophilization is insufficient). Furthermore, the ratio of the area of the location where hydrophilization is insufficient to the area of the cleaning liquid L in the reference image exceeds the second threshold, so it is determined that hydrophilization is not achieved.

The adjustment unit 34 adjusts the supply of the cleaning liquid L by the supply unit 130 depending on the determination result obtained by the determination unit 33. In one example, in the case where the hydrophilization is not achieved, the adjustment unit 34 causes the supply unit 130 to resupply the cleaning liquid L. When the hydrophilization is achieved, the adjustment unit 34 causes the substrate W to be transferred to the cleaning unit 200 without resupplying the cleaning liquid L.

<Operation>

Figure 5:
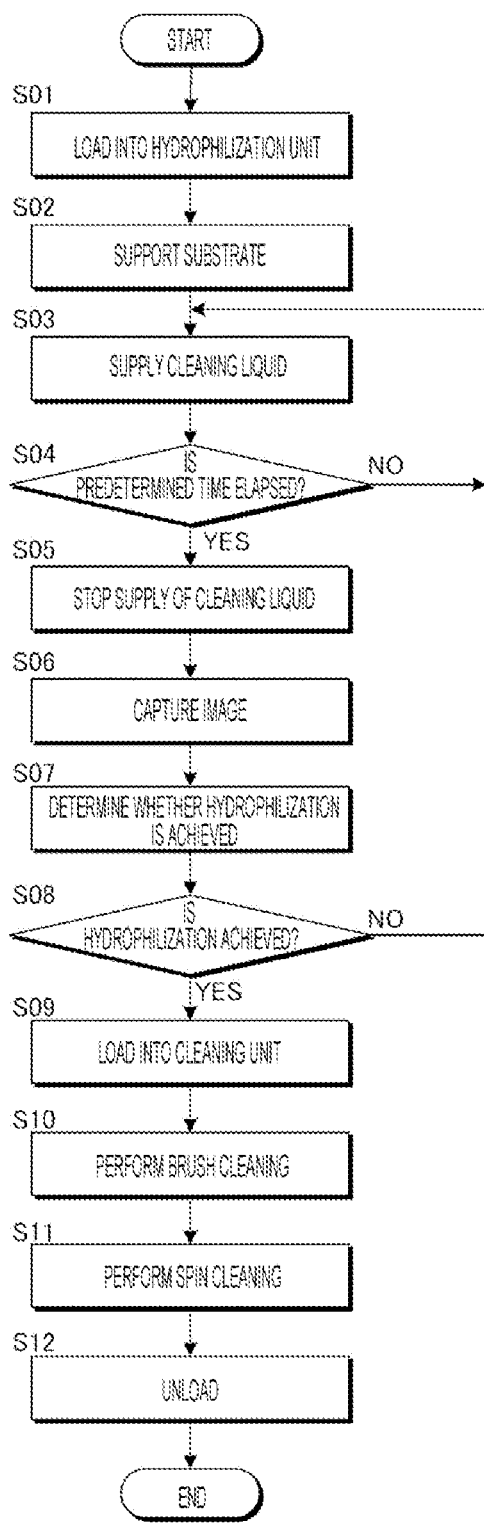
FIG. 5 is a flowchart illustrating the processing procedure performed by the substrate cleaning apparatus.

The operation of the substrate cleaning apparatus 1 configured as described above is now described with reference to the flowchart of FIG. 5 in addition to FIG. 1 to FIGS. 4A to 4E.

Initially, the robotic hand 151 loads the substrate W with the front and back surfaces polished by the polishing apparatus P into the chamber 110 (step S01), as illustrated in FIG. 2. The robotic hand 151 places the substrate W onto the support pins 121 of the support unit 120 (step S02). This procedure allows the substrate W to be horizontally supported.

The nozzle 131 of the supply unit 130 supplies the cleaning liquid L to the polished front and back surfaces of the substrate W, as illustrated in FIGS. 2 and 3A (step S03). Residual contaminants persisting from the CMP process (such as organic contaminants such as slurry, or metal impurities) adhere to the polished front and back surfaces of the substrate W. Spraying ozone-infused water onto such polished surfaces advances the formation of an oxide film and hydrophilization.

Upon elapse of the predetermined time interval (YES in step S04), the nozzle 131 stops the supply of the cleaning liquid L (step S05). Then, the imaging unit 140 captures an image of the substrate W from its lateral side (step S06), as illustrated in FIG. 3B. The determination unit 33 determines whether the hydrophilization is achieved based on the image captured by the imaging unit 140 and a pre-stored reference image (step S07). When it is determined that the hydrophilization is not achieved (NO in step S08), the nozzle 131 resupplies the cleaning liquid L (step S03). Then, the processing of steps S04 to S07 is reiterated.

When the determination unit 33 determines that the hydrophilization is achieved (YES in step S08), the robotic hand 231 loads the substrate W into the cleaning unit 200 (step S09). The robotic hand 231 initially loads the substrate W into the chamber 211, where the polished surface of the substrate W undergoes brush-cleaning (step S10). This allows contaminants on the polished surface of the substrate W to be discharged outside the substrate W by the brush 213a.

Subsequently, the robotic hand 231 loads the substrate W from the chamber 211 into the chamber 221. Then, in the chamber 221, spin cleaning is performed on the polished surface of the substrate W (step S11). After that, the robotic hand 231 unloads the substrate W from the chamber 221 (step S12).

<Effects>

(1) The substrate cleaning apparatus 1 according to the present embodiment as described above includes, the chamber 110 in which the substrate W is loaded, the substrate W having the polished surface polished by the polishing apparatus P; the support unit 120 provided in the chamber 110 to support the substrate W; the supply unit 130 configured to supply the polished surface of the substrate W supported by the support unit 120 with the cleaning liquid L and configured to hydrophilize the polished surface; the imaging unit 140 configured to capture an image of the polished surface supplied with the cleaning liquid L from a lateral side of the substrate W; the determination unit 33 configured to determine whether hydrophilization is achieved based on the image captured by the imaging unit 140; the adjustment unit 34 configured to adjust the supply of the cleaning liquid L by the supply unit 130 depending on a determination result obtained by the determination unit 33; and the cleaning unit 200 connected to the chamber 110 to clean, using the cleaning liquid L, the polished surface hydrophilized by the cleaning liquid L.

Therefore, it is possible to determine whether the substrate W subjected to polishing is hydrophilic, and to supply the cleaning liquid L to the substrate W until sufficient hydrophilization is achieved (until it is determined that hydrophilization is achieved). Thus, it is possible to prevent the cleaning by the cleaning unit 200 from being performed while the post-polished substrate W is in an insufficiently hydrophilized state. This results in the elimination of contaminants from the substrate W by the cleaning unit 200 with ease and efficiency.

Furthermore, the imaging unit 140 captures the image of the substrate W from the lateral side, which eliminates the need to install the imaging unit 140 directly above the substrate W. This prevents the substrate W from being contaminated by the cleaning liquid L that adheres to the imaging unit 140, and then fall and adheres to the substrate W. Moreover, the non-installation of the imaging unit 140 directly on the substrate W does not impede the downward flow.

Further, since the imaging unit 140 captures an image from the lateral side of the substrate W, it is possible to capture the conditions of both opposing polished surfaces of the substrate W. Therefore, it is also possible to determine whether the back surface of the substrate W is hydrophilic, which fails to be accomplished through image-capturing directly from above the substrate W. Inspection of both surfaces will require significant time, particularly in situations necessitating the inversion of the substrate W. In the present embodiment, the imaging unit 140 is able to capture the conditions of both surfaces of the substrate W simultaneously from the lateral side, so that the inspection may be performed in a short time. Furthermore, upon capturing an image from directly underneath the back surface, there is a risk of false detection due to liquid droplets adhering to the imaging unit 140. In the present embodiment, the imaging unit 140 is capable of capturing an image of the substrate W from the lateral side, thereby preventing false detection caused by the adhesion of liquid droplets to the imaging unit 140.

(2) The imaging unit 140 captures an image of the substrate W from its lateral side while the substrate W is supported in a stationary state by the support unit 120 while the supply of the cleaning liquid L by the supply unit 130 is stopped. Therefore, the cleaning liquid L is prevented from splashing on the imaging unit 140 upon capturing an image of the substrate W from the lateral side. In addition, due to the stationary nature of this arrangement, there is no wavering at the liquid level. Thus, it is possible for the determination unit 33 to accurately determine whether the hydrophilization is achieved.

(3) The substrate W has a polished surface on both sides. The supply unit 130 has a pair of nozzles 131 arranged at positions sandwiching the center of the substrate W and capable of ejecting the cleaning liquid L onto both polished surfaces of the substrate W. Thus, the supply unit 130 is capable of flowing the cleaning liquid L from both opposing directions to spread the cleaning liquid L across the entirety of the substrate W.

(4) The substrate W has a polished surface on both sides. The supply unit 130 includes the nozzles 131 provided at positions for supplying the cleaning liquid L to both opposing polished surfaces of the substrate W. Therefore, the supply unit 130 may supply the cleaning liquid L to both opposing polished surfaces with the cleaning liquid L, and the determination unit 33 may determine whether both surfaces are hydrophilic.

(5) The imaging unit 140 is positioned at multiple locations around the substrate W. Therefore, the determination unit 33 may determine whether the hydrophilization is achieved on the entire substrate W.

(6) The determination unit 33 determines whether the hydrophilization is achieved by comparing an image obtained by capturing the substrate W supplied with the cleaning liquid L and supported by the support unit 120 with a reference image obtained by capturing the substrate W hydrophilized by the cleaning liquid L as a reference. Therefore, the determination unit 33 may accurately determine whether the hydrophilization is achieved based on the reference image. As a more specific example, the determination unit 33 extracts contours of the substrate W and the cleaning liquid L from the captured image and the reference image and superimposes the captured image and the reference image such that the contours of the substrates match. The determination unit 33 determines that a portion where a distance between the contour of the cleaning liquid L and the contour of the substrate W is equal to or less than the first threshold in the captured image is insufficiently hydrophilized. The determination unit 33 calculates the ratio of the area of an insufficiently hydrophilized portion of the captured image to the area of the cleaning liquid L in the reference image, and when the ratio exceeds the second threshold, it determines that the hydrophilization is not achieved.

<Modifications>

The present embodiments are not limited to the embodiments mentioned above, and the following modifications may also be implemented.

(1) The determination approaches performed by the determination unit 33 are not limited to the embodiments mentioned above. The determination unit 33 may also determine the location that is not hydrophilized only by using the captured image. In one example, the determination unit 33 may determine whether the cleaning liquid L is hydrophilized based on the unevenness of the contour of the cleaning liquid L.

(2) The number of the nozzles 131 that eject the cleaning liquid L onto each polished surface may be any number that ensures even diffusion of the cleaning liquid L over the entire polished surface. It may be one or may be three or more. The supply unit 130 may also be configured to supply the cleaning liquid L to only one of the polished surfaces of the substrate W.

(3) The number of the cameras 141 in the imaging unit 140 may be any number that ensures the image-capturing of the substrate W from the lateral side. Thus, the number of cameras 141 may be two or fewer, or it may be four or more. The optical axes of the cameras 141 do not need to be perfectly parallel to the polished surface; they may have slight deviations or tilts.

(4) The embodiment may include a rotational device for rotating the substrate W, and the supply unit 130 may be configured to supply the substrate W with the cleaning liquid L while rotating the substrate W. This configuration allows for the even diffusion of the cleaning liquid L across the entire polished surface of the substrate W, regardless of the number of the nozzles 131.

(5) The brush-cleaning device 210 may be configured to clean the surface of the substrate W using a cylindrical brush with its axis parallel to the surface W.

(6) The supply of the cleaning liquid L by the supply unit 130 may be adjusted depending on the determination result of whether the hydrophilization of the substrate W is achieved by the determination unit 33, as follows. In one example, when it is determined that either the front or back polished surface of the substrate W fails to be hydrophilized, the amount or duration of supplying the cleaning liquid L from the nozzle 131 facing the relevant surface may be increased. Similarly, when it is determined that either the front or back polished surface of the substrate W is hydrophilized, the amount or duration of supplying the cleaning liquid L from the nozzle 131 facing the relevant surface may be decreased or stopped. Additionally, when it is determined that a location of the substrate W captured by one of the multiple imaging units 140 fails to be hydrophilized, an additional amount or duration of the cleaning liquid L may be provided from the nozzle 131 that is closest to the location determined as non-hydrophilic and is capable of supplying the cleaning liquid L to the relevant location in the imaging unit 140. Furthermore, for the nozzle 131 that may supply the cleaning liquid L to a location that is determined as hydrophilic and is closest to the imaging unit 140, the amount or duration of supplying the cleaning liquid L from the relevant nozzle 131 may be decreased or stopped.

From the foregoing, it will be appreciated that various embodiments of the present disclosure have been described herein for purposes of illustration, and that various Modifications may be made without departing from the scope and spirit of the present disclosure. Accordingly, the various exemplary embodiments disclosed herein are not intended to be limiting, with the true scope and spirit being indicated by the following claims.

What is claimed is:

1. A substrate cleaning apparatus comprising:
   a hydrophilization chamber connected to a polishing apparatus and configured to accommodate a substrate having a polished surface polished by the polishing apparatus;
   a support provided in the hydrophilization chamber and configured to support the substrate;
   a liquid supply configured to supply a cleaning liquid to the polished surface of the substrate supported by the support to hydrophilize the polished surface;
   a camera configured to capture an image of the polished surface supplied with the cleaning liquid, from a lateral side of the substrate;
   a cleaning chamber connected to the hydrophilization chamber and configured to clean the polished surface hydrophilized by the cleaning liquid; and
   a controller configured to control an overall operation of the substrate cleaning apparatus,
   wherein the controller includes:
   a determination circuitry configured to determine whether hydrophilization is achieved based on the image captured by the camera; and an adjustment circuitry configured to adjust the supply of the cleaning liquid by the liquid supply according to a determination result from the determination circuitry.

2. The substrate cleaning apparatus according to claim 1, wherein the camera captures an image of the substrate supported in a stationary state by the support from the lateral side of the substrate while the supply of the cleaning liquid by the liquid supply is stopped.

3. The substrate cleaning apparatus according to claim 1, wherein the substrate has polished surfaces on both sides, and
   the liquid supply includes at least a pair of nozzles arranged at positions sandwiching the center of the substrate and configured to eject the cleaning liquid onto at least one polished surface of the substrate.

4. The substrate cleaning apparatus according to claim 2, wherein the substrate has polished surfaces on both sides, and
   the liquid supply includes at least a pair of nozzles arranged at positions sandwiching the center of the substrate and configured to eject the cleaning liquid onto at least one polished surface of the substrate.

5. The substrate cleaning apparatus according to claim 1, wherein the substrate has polished surfaces on both sides, and
   the liquid supply includes a nozzle provided at a position for supplying the cleaning liquid to both of the opposing polished surfaces of the substrate.

6. The substrate cleaning apparatus according to claim 1, wherein a plurality of cameras is arranged around the substrate.

7. The substrate cleaning apparatus according to claim 1, wherein the determination circuitry determines whether the hydrophilization is achieved by comparing an image obtained by capturing the substrate in a state of being supplied with the cleaning liquid and supported by the support with a reference image of the substrate as a reference for a hydrophilic state by the cleaning liquid.

8. The substrate cleaning apparatus according to claim 7, wherein the determination circuitry
   extracts contours of the substrate and the cleaning liquid from the captured image and the reference image, and superimposes the captured image and the reference image such that the contours of the substrate match,
   determines that a portion where a distance between the contour of the cleaning liquid and the contour of the substrate is equal to or less than a first threshold in the captured image, is insufficiently hydrophilized, and
   calculates a ratio of an area of an insufficient hydrophilized portion of the captured image to an area of the cleaning liquid in the reference image, and
   when the ratio exceeds a second threshold, determines that hydrophilization is not achieved.

* * * * *